(12) United States Patent
Huang et al.

(10) Patent No.: US 8,665,920 B2
(45) Date of Patent: Mar. 4, 2014

(54) METHOD AND APPARATUS FOR LASER DIODE COMPENSATION

(75) Inventors: Heng Huang, Sammamish, WA (US); Mark Champion, Kenmore, WA (US)

(73) Assignee: Microvision, Inc., Redmond, WA (US)

( * ) Notice: Subject to any disclaimer, the term of this patent is extended or adjusted under 35 U.S.C. 154(b) by 614 days.

(21) Appl. No.: 12/894,730

(22) Filed: Sep. 30, 2010

(65) Prior Publication Data

US 2011/0181791 A1   Jul. 28, 2011

Related U.S. Application Data

(60) Provisional application No. 61/298,708, filed on Jan. 27, 2010.

(51) Int. Cl.
*H01S 5/042* (2006.01)
*H01S 5/068* (2006.01)

(52) U.S. Cl.
USPC .................................. 372/38.01; 372/38.02

(58) Field of Classification Search
USPC ............................................ 372/38.01, 38.02
See application file for complete search history.

(56) References Cited

U.S. PATENT DOCUMENTS 5,844,928 A  *  12/1998  Shastri et al. ............... 372/38.02

* cited by examiner

*Primary Examiner* — Jessica Stultz
*Assistant Examiner* — Michael Carter
(74) *Attorney, Agent, or Firm* — Kevin D. Wills

(57) ABSTRACT

The luminance of a laser diode is a function of laser diode drive current. The luminance is also a function of other factors, such as age and temperature. A laser projection device includes laser diodes to generate light in response to a commanded luminance, and also includes photodiodes to provide a measured luminance. The commanded luminance and measured luminance are compared, and drive currents for the laser diodes are adjusted to compensate for changes in laser diode characteristics.

2 Claims, 10 Drawing Sheets

METHOD AND APPARATUS FOR LASER DIODE COMPENSATION

CROSS-REFERENCE TO RELATED APPLICATIONS

The present application claims the benefit of U.S. Provisional Application No. 61/298,708 filed Jan. 27, 2010. Said Application No. 61/298,708 is hereby incorporated by reference in its entirety.

FIELD

The present invention relates generally to laser projection systems, and more specifically to compensation for nonlinearities in laser projection systems.

BACKGROUND

Laser diodes emit light when current is passed through the diode. The output luminance of the laser diode varies as the drive current through the diode is varied. The output luminance of the laser diode may also vary due to other factors. For example, the output luminance of the laser diode may vary with age. Also for example, the output luminance of the laser diode may vary as the temperature of the diode varies. This can be problematic in part because the temperature of a laser diode may be affected by ambient temperature changes as well as the historical drive current which results in "self-heating" of the diode.

Laser projectors that utilize laser diodes for light generation may suffer from variations in luminance as a result of aging, temperature changes, and other factors. These problems may occur in both monochrome and color laser projectors. For example, monochrome laser projectors may suffer from non-uniform greyscale displays over time. Similarly, the luminance of the various colors in a displayed image may change as the luminance of each color laser diode in a color projector changes. The color balance may also be affected if different color laser diodes have different responses to factors that affect luminance (e.g., aging, temperature, etc.).

DESCRIPTION OF EMBODIMENTS

Figure 1:
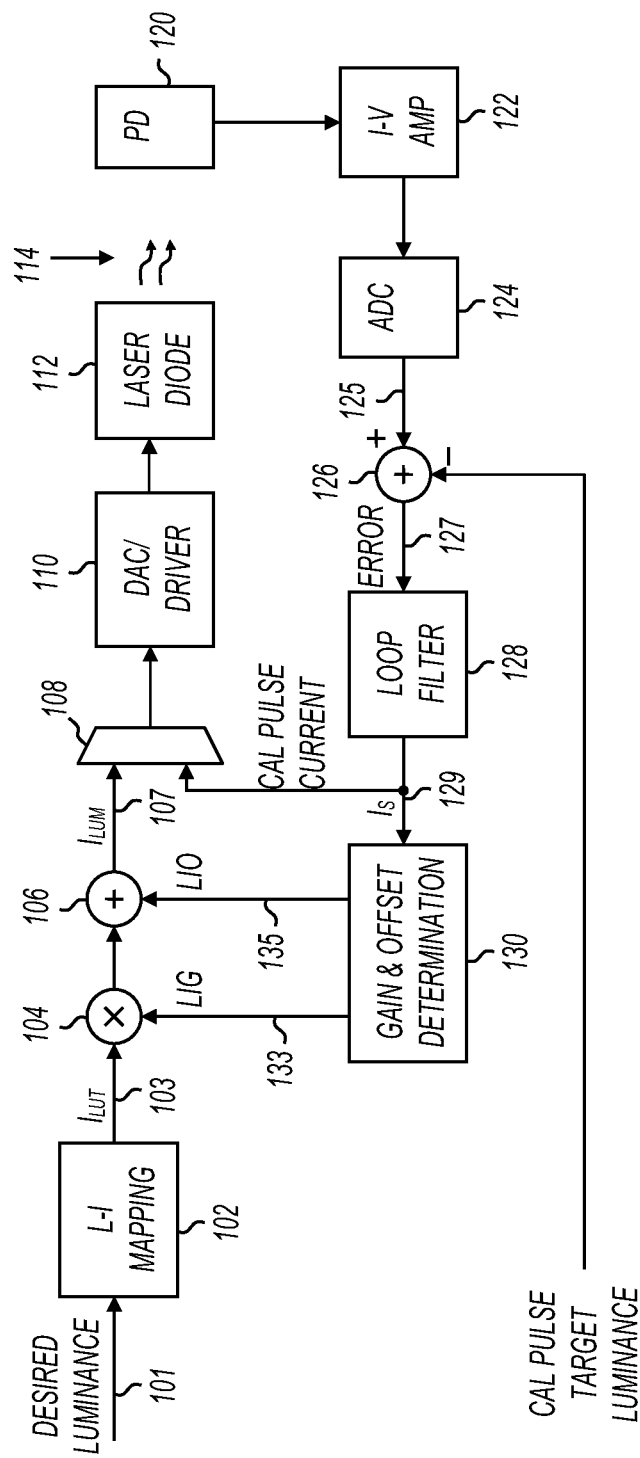
FIG. 1 shows a laser projection apparatus with laser diode drive current compensation.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a laser projection apparatus with laser diode drive current compensation. Laser projection apparatus 100 produces laser light 114 in response to a desired luminance value on node 101. The luminance value may be produced by any appropriate data source, and the resulting laser light may be projected for any purpose. For example, in some embodiments, an image processing apparatus may provide the desired luminance value, and laser projection apparatus 100 may display an image.

Apparatus 100 includes luminance to drive current (L-I) mapping 102, multiplier 104, adder 106, multiplexer 108, digital-to-analog converter (DAC) and driver 110, and laser diode 112. Apparatus 100 also includes a feedback loop that includes photodiode 120, transimpedance amplifier (I-V AMP) 122, analog-to-digital converter (ADC) 124, difference circuit 126, loop filter 128, and gain and offset determination component 130.

Laser diode 112 has a nonlinear temperature dependent drive current to output luminance characteristic. A typical laser diode characteristic is shown at 220 in FIG. 2. Mapping component 102 substantially implements the inverse of the laser diode characteristic. In some embodiments, mapping component 102 is a look-up table that is indexed by the desired luminance value. A typical mapping component characteristic is shown at 210 in FIG. 2. When the characteristic of the mapping component is combined with the characteristic of the laser diode at a particular temperature, a substantially linear result is obtained (shown at 230 in FIG. 2).

Figure 3:
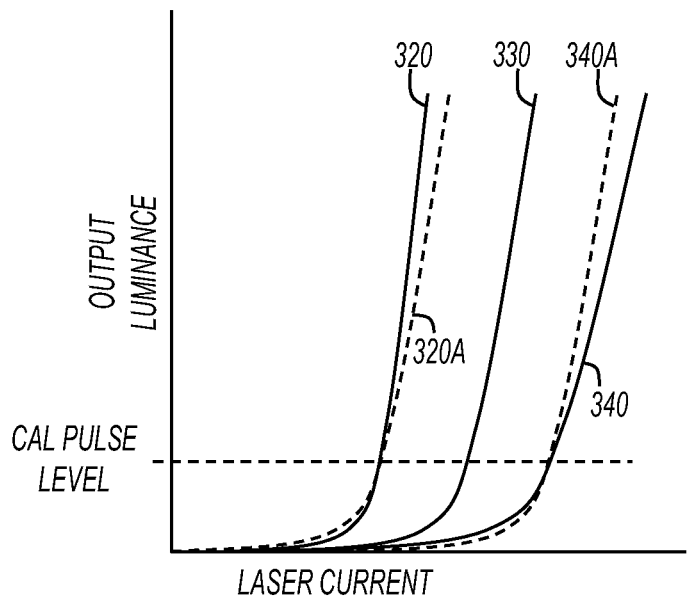
FIG. 3 shows a family of laser diode characteristic curves.

Due to various factors, including temperature and age, the laser diode characteristic may change over time. For example, FIG. 3 shows a family of laser diode characteristic curves. As seen in FIG. 3, the laser diode output luminance may take on different values for the same drive current depending on which of the curves correctly describes operation of the laser diode.

Curve 330 may describe a nominal operating condition for a laser diode. For example, a new diode operating at 25 degrees Celsius may operate in accordance with curve 330. As the temperature increases and/or the diode ages, the operation of the diode may be more correctly described by a curve to the right (e.g., 340). As the temperature decreases, the operation of the diode may be more correctly described a curve to the left (e.g., 320). During operation of a laser projection apparatus, the operating characteristic of laser diode(s) may continuously vary between the family of curves shown in FIG. 3.

Some lasers may exhibit behavior in which the characteristic for any temperature is observed to be substantially equal to performance at any other temperature with an appropriate scalar applied to the current. This is shown in FIG. 3 by curves 320, 330, and 340. Some other lasers may exhibit a different behavior in which the knee current increases with temperature but slope efficiency remains substantially constant, as shown by curves 320A and 340A. FIG. 3 illustrates that depending on the characteristic of the laser diode, laser power will be correct for all temperatures at the calibration pulse level (shown as the horizontal dashed line), however at higher luminance levels, the laser will be too dim or too bright. This condition will negatively impact laser power control as well as color balance.

Figure 2:
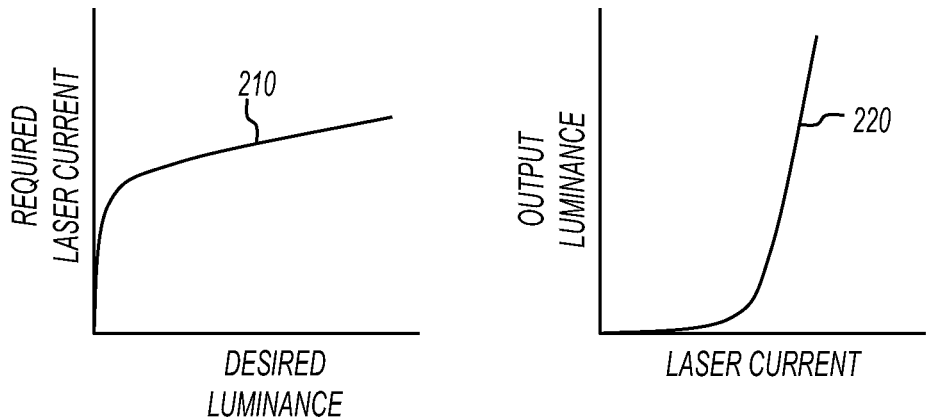
FIG. 2 shows various characteristics for luminance-to-current mappings, laser diodes, and combinations thereof.
Figure 2:
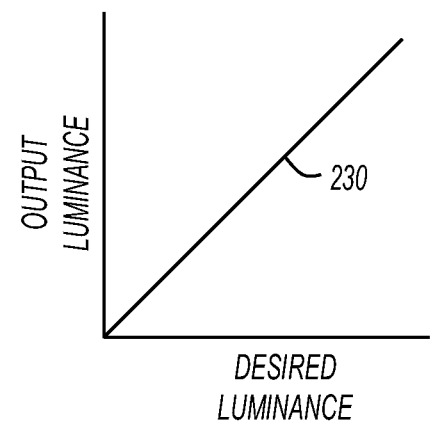

Various embodiments of the present invention compensate for the variations shown in FIG. 3 by increasing or decreasing the drive current as necessary to substantially maintain an overall linear system characteristic (as exemplified by 230 in FIG. 2).

Referring now back to FIG. 1, in operation, mapping component 102 receives a desired luminance value on node 101, and maps the desired luminance to a nominal drive current value $I_{LUT}$ on node 103. The mapping of desired luminance to nominal drive current represents the inverse of the laser diode temperature dependent characteristic at one temperature. For example, mapping component 102 may map luminance values to drive current values to compensate for the nominal laser diode operating curve 330 (FIG. 3). Accordingly, when the laser diode is operating at the same temperature as represented by data in mapping component 102, a linear grayscale light output can be generated as a function of the desired luminance values.

As shown in FIG. 1, the nominal drive current value $I_{LUT}$ on node 103 is used to create an actual drive current value $I_{LUM}$ according to:

$$I_{LUM} = I_{LUT} * LIG + LIO \quad (1)$$

where LIG is a gain term applied by multiplier 104, LIO is an offset term applied by adder 106, and $I_{LUT}*LIG$ is a scaled laser diode current value.

Multiplexer 108 selects between the drive current value $I_{LUM}$ on node 107 and a calibration pulse current value $I_S$ on node 129, and provides the selected data to DAC/driver 110. DAC/driver 110 converts the output of multiplexer 108 into an analog current suitable to drive laser diode 112. In response to the drive current, laser diode 112 produces light at 114.

Laser diode 112 may heat up or cool off based on ambient temperature changes. Further, laser diode 112 may heat up when emitting light. Further, multiple historical drive currents may have a cumulative heating effect on laser diode 112. As described above with reference to FIG. 3, as the temperature of a laser diode changes, the luminance for a given drive current also changes. This can result in variations in overall luminance (brightness) of a displayed image. Other factors may also affect laser diode luminance over time. For example, the luminance of laser diodes may change over time due to aging.

Apparatus 100 includes a feedback loop to compensate for changes in laser diode characteristics. These changes may be due to temperature, aging, or any other factor. The feedback loop includes photodiode (PD) 120 to measure the actual output luminance of laser diode 112 when a calibration pulse is selected by multiplexer 108 (or at other times; see below). The current output from photodiode 120 is processed by transimpedance amplifier 122 to provide a voltage to ADC 124. The magnitude of the voltage on node 125 corresponds to the measured output luminance.

Difference circuit 126 takes the difference between the calibration pulse target luminance value and the measured output luminance value to produce an error term on node 127. In response to the error value on node 127, loop filter 128 adjusts the calibration pulse current value $I_S$ to reduce the error.

Gain and offset determination component 130 receives the calibration pulse current value $I_S$ on node 129 and modifies a gain value LIG on node 133 and an offset value LIO on node 135 in response thereto. If the calibration pulse current value $I_S$ increases, gain and offset determination component 130 increases LIG, or LIO, or both, thereby increasing the drive current provided to the laser diode. If the calibration pulse value $I_S$ decreases, gain and offset determination component 130 decreases LIG, or LIO, or both, thereby decreasing the drive current provided to the laser diode.

In some embodiments, multiplexer 108 periodically selects the calibration pulse data to provide to DAC/Driver 110. When this occurs, laser diode 112 outputs light corresponding to the last calibration pulse current value $I_S$. The feedback loop then measures the light produced in response to the calibration pulse, and adjusts $I_S$, LIG, and LIO accordingly.

The various embodiments of the present invention take advantage of the observation that the laser diode's current to luminance characteristic varies in a predictable way over temperature. Specifically, the characteristic for any temperature is observed to be substantially equal to performance at any other temperature with an appropriate scalar and offset applied to the current. For example, a nominal laser diode current to luminance characteristic can be written as follows:

$$L_{T0} = f(I_{T0}) \quad (2)$$

where $L_{T0}$ is luminance and $I_{T0}$ is current at temperature T0. This equation can be inverted to show current as a function of desired luminance as follows:

$$I_{T0} = g(L_{T0}) \quad (3)$$

When equation (2) represents a nominal diode characteristic such as 220 (FIG. 2), then equation (3) represents a mapping component characteristic such as 210 (FIG. 2) that compensates for the nominal case. As the temperature changes, the functions $f$ and $g$ change, but the second function can be approximated by:

$$I_{T1} = I_{T0} * LIG + LIO \quad (4)$$

where LIG and LIO are temperature dependent scalars with finite ranges. The laser diode characteristic behaves similarly with age.

Taking advantage of the above observation, various embodiments of the present invention can, with a single calibration pulse, measure the difference between the laser diode's nominal operating characteristic and an existing operating characteristic. Further, the calibration pulse can be at any brightness, including dim enough so as to be virtually invisible to an observer. The calibration pulse is issued, the resulting luminance is measured and then compared with the expected luminance corresponding to the calibration pulse, and then the calibration pulse drive current value is modified to reduce the error.

Gain and offset determination component 130 determines values for both LIG and LIO. Solving for two unknown parameters typically requires two equations. Various embodiments of the present invention determine values for LIG and LIO using various different methods. These methods are discussed further below.

Figure 4:
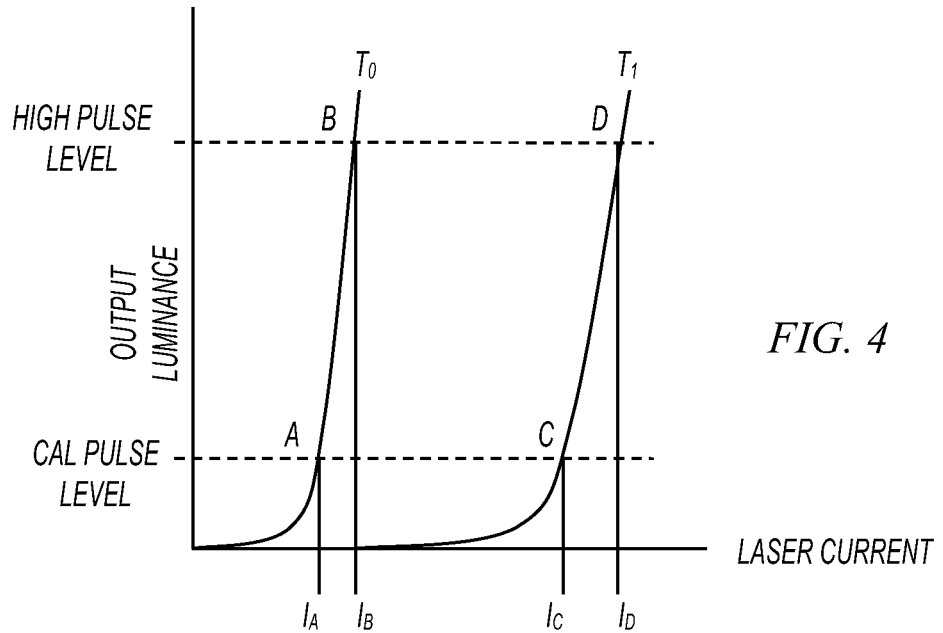
FIG. 4 shows two temperatures over which a laser diode may be calibrated.

Referring to FIG. 4, some embodiments of the present invention determine values for LIG and LIO by evaluating the I-L characteristics for two luminance levels at two different temperatures—a total of four data points. For example, LIG and LIO can be computed from currents $I_A$, $I_B$, $I_C$, and $I_D$. $I_A$ and $I_B$ are known when I-L characterization is performed on the system at temperature T0. $I_C$ and $I_D$ are determined when the laser is operating at some higher temperature T1. Once these four currents are known, they are used to solve the following equations for LIG and LIO at temperature T1.

$$I_C = I_A * LIG_{T1} + LIO_{T1} \quad (5)$$

$$I_D = I_B * LIG_{T1} + LIO_{T1} \quad (6)$$

Solving for LIG and LIO at temperature T1, $$LIG_{T1} = \frac{I_D - I_C}{I_B - I_A} \quad (7)$$

$$LIO_{T1} = \frac{I_B I_C - I_A I_D}{I_B - I_A}. \quad (8)$$

Equations (7) and (8) show that in some embodiments, two feedback loops may be employed to determine values for LIG and LIO. However, some embodiments of the invention have only one feedback loop running at a given low luminance level so the calibration pulses will be less visible. These embodiments take advantage of the further developed laser model (below) so the two parameters, LIG and LIO can be derived from a single variable $I_S$.

In FIG. 4, as temperature varies from T0 to T1, LIG varies from 1 to $LIG_{T1}$ and LIO varies from 0 to $LIO_{T1}$. The increase in drive current at that calibration pulse target, $\Delta I = I_C - I_A$ is a function of $\Delta LIG$ and $\Delta LIO$.

$$\Delta I = I_C - I_A = I_A * (LIG - 1) + (LIO - 0) = I_A * \Delta LIG + \Delta LIO \quad (9)$$

Various embodiments of the present invention assume that $\Delta LIO$ is proportional to $\Delta I$ e.g., $\Delta LIO = OCC * \Delta I$, where OCC is the Offset Correction Coefficient which is constant for a given laser (but may vary from laser to laser). Equation (9) then becomes the following:

$$\Delta I = I_{LUT} * \Delta LIG + (OCC * \Delta I) \quad (10)$$

$$\Delta LIG = \left(\frac{1 - OCC}{I_{LUT}}\right) * \Delta I \quad (11)$$

The OCC term can be determined once at calibration time by characterizing the laser to two temperatures as depicted in FIG. 4. After $LIO_{T1}$ is determined by equation 8, OCC can be derived as follows:

$$OCC = \frac{LIO_{T1}}{I_C - I_A} = \frac{I_B I_C - I_A I_D}{(I_B - I_A)(I_C - I_A)} \quad (12)$$

Figure 5:
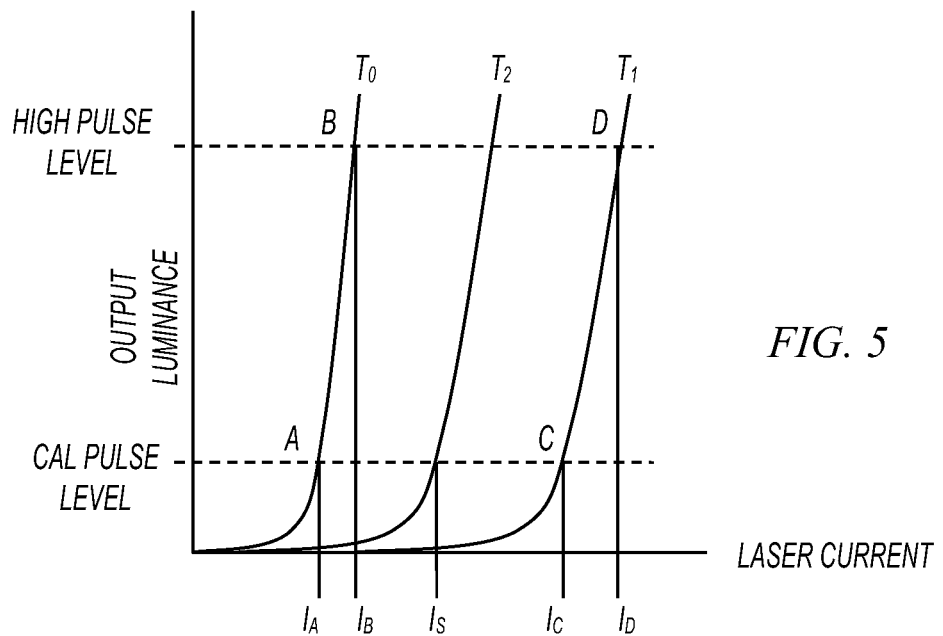
FIG. 5 shows calibration pulse current level changing over temperature.

During operation as the temperature changes from T0 to T2, the calibration pulse current required to produce the calibration pulse target luminance changes from $I_A$ to $I_S$ as shown in FIG. 5. The purpose of the calibration pulse is to determine $I_S$. $I_S$ provides the information necessary to compute LIO and LIG at temperature T2. Applying the laser model, $$I_S = I_A * LIG_{T2} + LIO_{T2} \quad (13)$$

and writing $\Delta LIO$ and $\Delta LIG$ as functions of OCC, $$\Delta LIO = OCC * \Delta I \quad (14)$$

$$\Delta LIG = \left(\frac{1 - OCC}{I_{LUT}}\right) * \Delta I. \quad (15)$$

Solving for LIO and LIG, $$LIO = \Delta LIO = (I_S - I_A) * OCC \quad (16)$$

$$LIG = 1 + \Delta LIG = 1 + (I_S - I_A) * \left(\frac{1 - OCC}{I_A}\right) \quad (17)$$

$$LIG = \frac{I_S}{I_A} - (I_S - I_A) * \frac{OCC}{I_A} \quad (18)$$

$$LIG = \frac{I_S}{I_A} - \frac{LIO}{I_A}. \quad (19)$$

Therefore, once OCC is known for any given laser, both $\Delta LIO$ and $\Delta LIG$ can be derived from $\Delta I$, which is the difference in drive current required to achieve the calibration pulse target luminance relative to the drive current determined during calibration. According to various embodiments of the present invention, the above formulas work for determining LIO and LIG at any temperature including temperatures below T0 and above T2.

Figure 6:
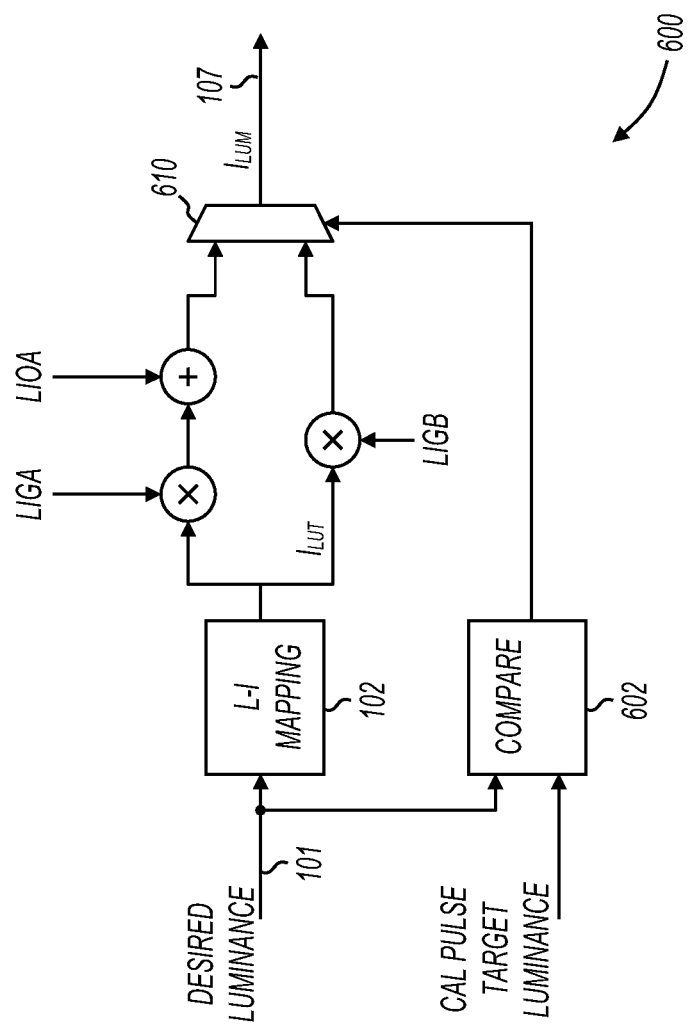
FIG. 6 shows laser diode drive current compensation above and below a calibration pulse level.

FIG. 6 shows laser diode drive current compensation above and below a calibration pulse level. If a laser driver circuit is designed to utilize both LIG and LIO, and if LIO is a non-zero value, then the driver will output laser current even when the desired luminance is zero. This is incorrect from a laser power control perspective and undesirable from a power efficiency perspective. Various embodiments of the present invention use two different laser models: one for luminance values below the calibration pulse level, and another for luminance values above the calibration pulse level.

In these embodiments, for luminance values above the calibration pulse level, the drive current value is determined as $$I_{LUM} = I_{LUT} * LIGA + LIOA, \quad (20)$$

where LIGA and LIOA are determined using equations (19) and (16), respectively. For luminance values below the calibration pulse level, the drive current value is determined as $$I_{LUM} = I_{LUT} * LIGB. \quad (21)$$

where LIGB is determined as $$LIGB = \frac{I_S}{I_A} \quad (22)$$

Note the use of the suffixes A and B which denote "above" and "below" the calibration pulse level respectively.

Hardware implementations for these embodiments are represented in FIG. 6. The calibration pulse target luminance is compared (602) with the desired output luminance to determine if the desired output luminance is above or below the calibration pulse target luminance. When the desired luminance is below the calibration pulse target luminance, multiplexer 610 selects operation according to equation (21), and when desired luminance is above the calibration pulse target luminance, multiplexer 610 selects operation according to equation (20).

When LIOA, LIGA, and LIGB are correctly computed, $I_{LUM}$ will agree at the calibration pulse target luminance. A block diagram of the complete control algorithm is shown in FIG. 7.

Figure 7:
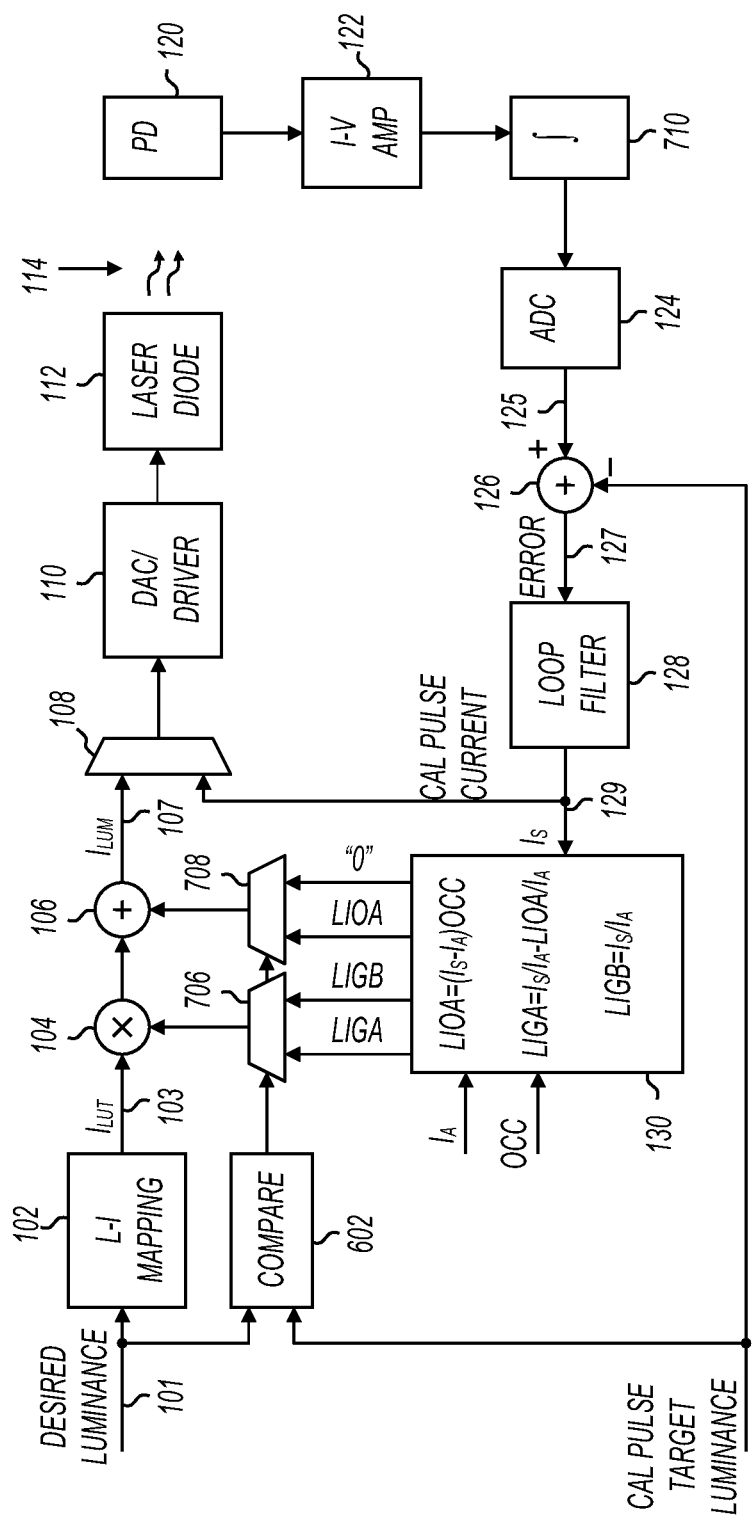
FIG. 7 shows a laser projection apparatus with laser diode drive current compensation.

FIG. 7 shows a laser projection apparatus with laser diode drive current compensation. Laser projection apparatus 700 is a circuit that includes a laser diode, a photodiode, and other associated circuitry to compensate for changes in laser diode characteristics that result from temperature changes and aging. The apparatus shown in FIG. 7 compensates one color channel. For example, the apparatus of FIG. 7 may compensate for changes in a red laser diode, a green laser diode, a blue laser diode, or any other color laser diode.

Apparatus 700 may function in various modes of operation. For example, apparatus 700 may operate in a calibration mode to characterize laser diode 112 during manufacture by measuring $I_S$, $I_A$, $I_B$, $I_C$, and $I_D$ (see FIG. 5). During the calibration mode, the OCC for the laser diode is determined according to equation (12) and stored for use by gain and offset determination component 130.

Also for example, apparatus 700 may operate in a normal mode in which the desired luminance value at 101 may change to represent the brightness of successive pixels to be displayed, and laser diode 112 produces light at 114 corresponding to the desired luminance. Also during normal operation, a calibration pulse current is periodically passed through laser diode 112, and laser diode 112 produces light at 114 that corresponds to the calibration pulse current. For example, in some embodiments, calibration pulses are sent at the end of every video frame or every nth video frame. In some embodiments, the calibration pulses may be sent when the laser light is out of the normal display area, thereby reducing unwanted light in an image. It should be noted, however, that the calibration can be performed with any frequency and/or periodicity and in any location relative to a displayed image without departing from the scope of the present invention.

As described above with reference to FIG. 1, loop filter 128 determines a calibration pulse drive current value $I_S$ in response to the error term at 127. $I_S$ is provided to gain and offset determination component 130. Loop filter 128 may be any suitable loop filter of any order. For example, in some embodiments, loop filter 218 is a first order filter, and in other embodiments, loop filter 128 is a second order filter. In some embodiments, loop filter 128 includes a proportional-integral-differential (PID) controller. For example, the calibration pulse drive current value on node 129 may be a function of the current error value (proportional), a sum of past error values (integral), or the rate of change of error values (differential), or any combination thereof. Any suitable loop filter may be utilized without departing from the scope of the present invention.

Gain and offset determination component 130 determines values for LIGA, LIGB, and LIOA in accordance with the teachings herein. In some embodiments, component 130 is implemented in hardware. For example, an application specific integrated circuit (ASIC) may include hardware structures to determine the values as shown. In other embodiments, component 130 is implemented in a combination of hardware and software. For example, component 130 may determine values for LIGA, LIGB, and LIOA by executing instructions in a processor. The processor may also be part of an ASIC.

Multiplexers 706 and 708 select LIG and LIO values based on the comparison between the desired luminance value and the calibration pulse target luminance. When the desired luminance is below the calibration pulse target luminance, then multiplexer 706 selects LIGB, and multiplexer 708 selects "0". When the desired luminance is above the calibration pulse target luminance, then multiplexer 706 selects LIGA, and multiplexer 708 selects LIOA. This implements the same logic as shown in FIG. 6.

Apparatus 700 includes a luminance measurement apparatus to measure luminance during calibration. The luminance measurement apparatus includes photodiode 120, transimpedance amplifier 122, integrator 710, and analog-to-digital converter (ADC) 124. Photodiode 120 detects light emitted from laser diode 112, and supplies a proportional current to transimpedance amplifier 122. Voltage output from transimpedance amplifier 122 is integrated in the analog domain for a period of time to increase signal-to-noise ratio (SNR). The integration time may be set to any value without departing from the scope of the present invention. In some embodiments, multiple integration periods are used. For example, photodiode dark current and transimpedance amplifier offsets may be compensated for by integrating first a short calibration pulse and then a long calibration pulse over the same time period and then subtracting to find the difference. ADC 124 converts the integrated voltage to a digital value. The output of ADC 124 is proportional to the amount of light detected by photodiode 120 during the integration period.

The various components shown in FIG. 7 can be implemented in many different ways. For example, various components may be implemented in digital hardware, analog hardware, software, or any combination. Further, the various embodiments of the present invention may be implemented with any level of integration. For example, many of the components may be included in application specific integrated circuits.

In some embodiments, calibration is not performed over multiple temperatures during manufacture. For example, a laser diode may be characterized over one temperature at the time of manufacture to save time and expense.

Referring now back to FIG. 4, apparatus 700 may be calibrated only at temperature T0. This provides the apparatus with a value for $I_A$, but does not provide enough information to compute OCC. Some embodiments of the present invention may select a start value for the OCC term, and then dynamically adjust the OCC term during operation.

Figure 8:
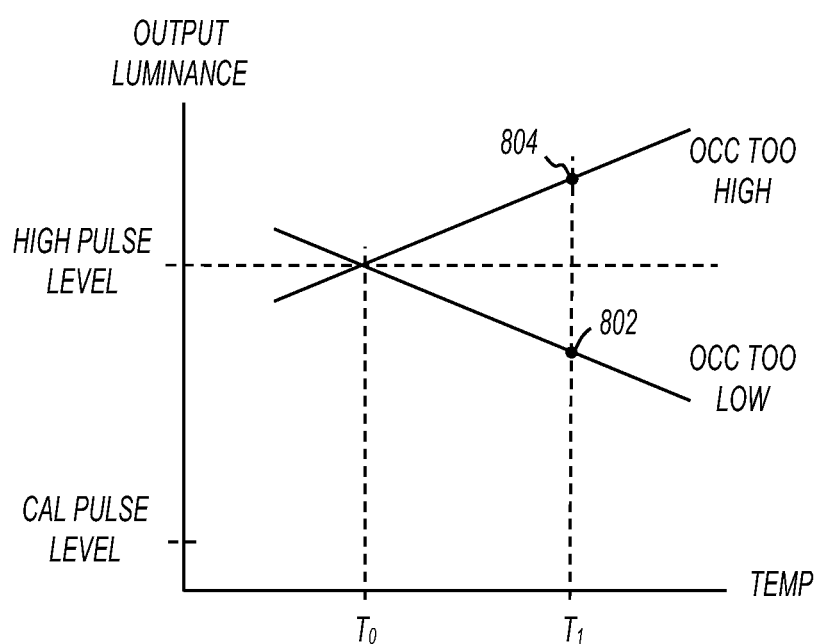
FIG. 8 shows values of a calibration term over temperature.

FIG. 8 shows values of a calibration term over temperature. As shown in FIG. 8, if the OCC term is too high, then an output luminance 804 will be higher than expected at a higher temperature. Likewise, if the OCC term is too low, then an output luminance 802 will be lower than expected at a higher temperature. Some embodiments of the present invention servo the OCC term in a manner similar to the $I_S$ term. For example, when the apparatus reaches T1, the apparatus may determine $I_S$ using the methods described above, and then may determine OCC by sending calibration pulses at a higher luminance output shown at 810 in FIG. 8.

Figure 9:
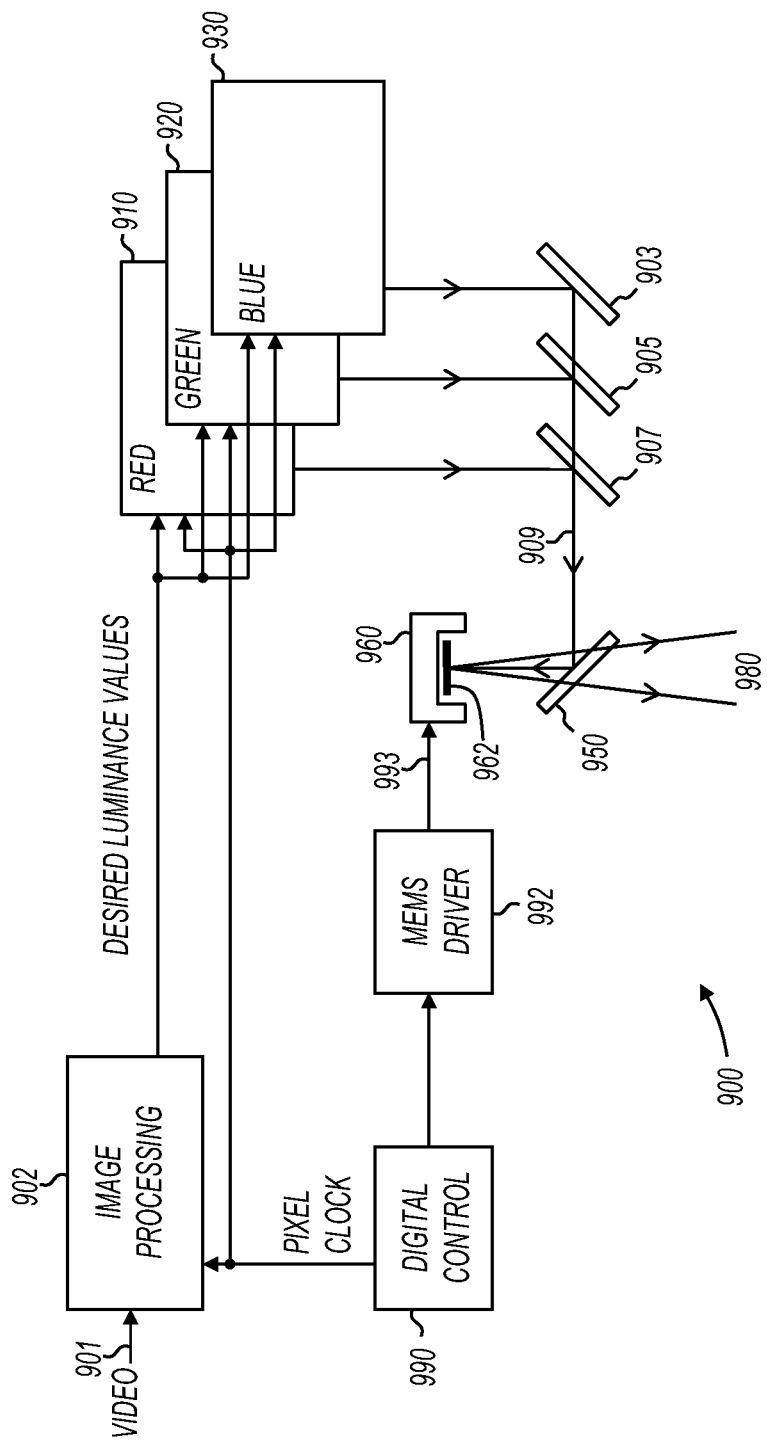
FIG. 9 shows a color laser projector.

FIG. 9 shows a color laser projection apparatus. System 900 includes image processing component 902, laser light sources 910, 920, and 930. Projection system 900 also includes mirrors 903, 905, and 907, fold mirror 950, microelectronic machine (MEMS) device 960 having mirror 962, MEMS driver 992, and digital control component 990.

In operation, image processing component 902 receives video data on node 901, receives a pixel clock from digital control component 990, and produces commanded drive values to drive the laser light sources when pixels are to be displayed. Image processing component 902 may include any suitable hardware and/or software useful to produce commanded drive values from video data. For example, image processing component 902 may include application specific integrated circuits (ASICs), one or more processors, or the like.

Laser light sources 910, 920, and 930 receive commanded drive values and produce light. Laser light sources 910, 920, and 930 may include any of the laser drive apparatus described herein. For example, laser light sources 910, 920, and 930 may include any of apparatus 100 (FIG. 1), 600 (FIG. 6), or 700 (FIG. 7).

Each light source produces a narrow beam of light which is directed to the MEMS mirror via guiding optics. For example, blue laser light source 930 produces blue light which is reflected off mirror 903 and is passed through mirrors 905 and 907; green laser light source 920 produces green light which is reflected off mirror 905 and is passed through mirror 907; and red laser light source 910 produces red light which is reflected off mirror 907. At 909, the red, green, and blue light are combined. The combined laser light is reflected off mirror 950 on its way to MEMS mirror 962. The MEMS mirror rotates on two axes in response to electrical stimuli received on node 993 from MEMS driver 992. After reflecting off MEMS mirror 962, the laser light bypasses mirror 950 to create an image at 980.

Color laser projector 900 may characterize one or more laser diodes during manufacture or during operation. Further, color laser projector 900 may measure laser output power at multiple temperatures during manufacture or during operation. In some embodiments, color laser projector estimates an OCC term and then modifies the term during operation at different temperatures.

Some embodiments may use calibration pulses to determine gain and offset terms for laser diodes. For example, in some embodiments, each laser light source 910, 920, and 930 may perform a calibration using a calibration pulse at the end of a vertical sweep. Each laser light source 910, 920, and 930 may simultaneously perform the calibration, or each laser light source 910, 920, and 930 may perform calibrations in series. In some embodiments, each laser light source 910, 920, and 930 perform a calibration every third vertical sweep. In these embodiments, one of the laser projection apparatus performs a calibration for each video frame.

The MEMS based projector is described as an example application, and the various embodiments of the invention are not so limited. For example, the electro-optical modulation apparatus described herein may be used with other optical systems without departing from the scope of the present invention.

Figure 10:
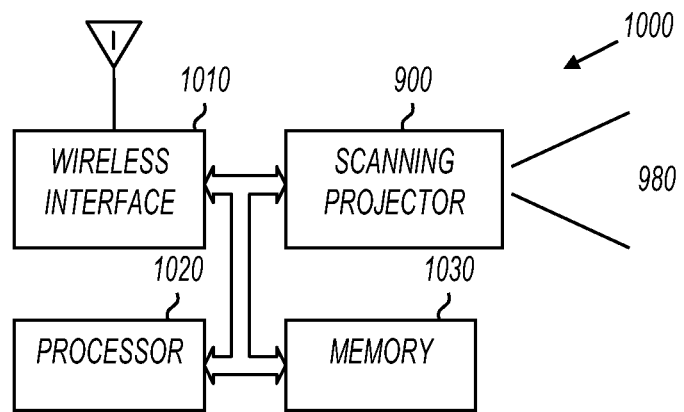
FIG. 10 shows a block diagram of a mobile device in accordance with various embodiments of the present invention.

FIG. 10 shows a block diagram of a mobile device in accordance with various embodiments of the present invention. As shown in FIG. 10, mobile device 1000 includes wireless interface 1010, processor 1020, memory 1030, and scanning projector 900. Scanning projector 900 paints a raster image at 980. Scanning projector 900 is described with reference to FIG. 9. In some embodiments, scanning projector 900 includes one or more laser light sources that include laser diode compensation circuits with gain and offsets, such as those shown in, and described with reference to, earlier figures.

Scanning projector 900 may receive image data from any image source. For example, in some embodiments, scanning projector 900 includes memory that holds still images. In other embodiments, scanning projector 900 includes memory that includes video images. In still further embodiments, scanning projector 900 displays imagery received from external sources such as connectors, wireless interface 1010, or the like.

Wireless interface 1010 may include any wireless transmission and/or reception capabilities. For example, in some embodiments, wireless interface 1010 includes a network interface card (NIC) capable of communicating over a wireless network. Also for example, in some embodiments, wireless interface 1010 may include cellular telephone capabilities. In still further embodiments, wireless interface 1010 may include a global positioning system (GPS) receiver. One skilled in the art will understand that wireless interface 1010 may include any type of wireless communications capability without departing from the scope of the present invention.

Processor 1020 may be any type of processor capable of communicating with the various components in mobile device 1000. For example, processor 1020 may be an embedded processor available from application specific integrated circuit (ASIC) vendors, or may be a commercially available microprocessor. In some embodiments, processor 1020 provides image or video data to scanning projector 900. The image or video data may be retrieved from wireless interface 1010 or may be derived from data retrieved from wireless interface 1010. For example, through processor 1020, scanning projector 900 may display images or video received directly from wireless interface 1010. Also for example, processor 1020 may provide overlays to add to images and/or video received from wireless interface 1010, or may alter stored imagery based on data received from wireless interface 1010 (e.g., modifying a map display in GPS embodiments in which wireless interface 1010 provides location coordinates).

Figure 11:
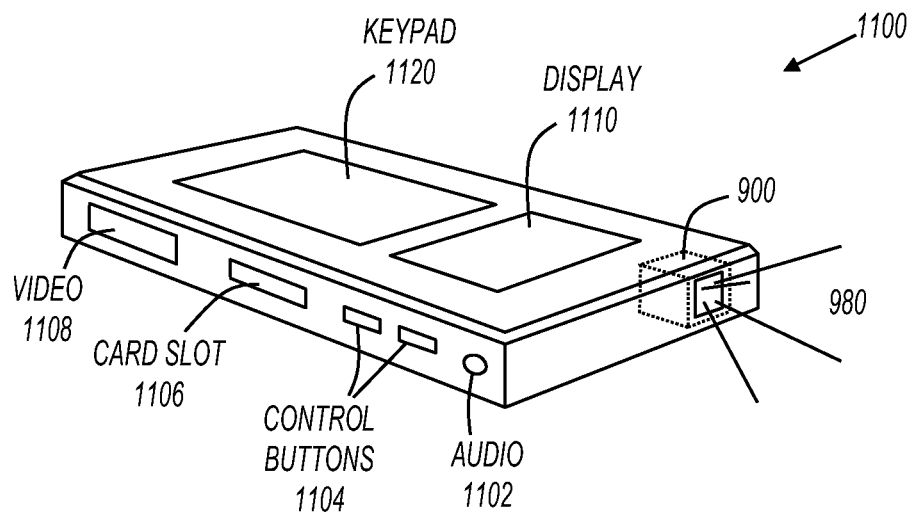
FIG. 11 shows a mobile device in accordance with various embodiments of the present invention.

FIG. 11 shows a mobile device in accordance with various embodiments of the present invention. Mobile device 1100 may be a hand held projection device with or without communications ability. For example, in some embodiments, mobile device 1100 may be a handheld projector with little or no other capabilities. Also for example, in some embodiments, mobile device 1100 may be a device usable for communications, including for example, a cellular phone, a smart phone, a personal digital assistant (PDA), a global positioning system (GPS) receiver, or the like. Further, mobile device 1100 may be connected to a larger network via a wireless (e.g., WiMax) or cellular connection, or this device can accept data messages or video content via an unregulated spectrum (e.g., WiFi) connection.

Mobile device 1100 includes scanning projector 900 to create an image with light at 980. Mobile device 1100 also includes many other types of circuitry; however, they are intentionally omitted from FIG. 11 for clarity.

Mobile device 1100 includes display 1110, keypad 1120, audio port 1102, control buttons 1104, card slot 1106, and audio/video (A/V) port 1108. None of these elements are essential. For example, mobile device 1100 may only include scanning projector 900 without any of display 1110, keypad 1120, audio port 1102, control buttons 1104, card slot 1106, or A/V port 1108. Some embodiments include a subset of these elements. For example, an accessory projector product may include scanning projector 900, control buttons 1104 and A/V port 1108.

Display 1110 may be any type of display. For example, in some embodiments, display 1110 includes a liquid crystal display (LCD) screen. Display 1110 may always display the same content projected at 980 or different content. For example, an accessory projector product may always display the same content, whereas a mobile phone embodiment may project one type of content at 980 while display different content on display 1110. Keypad 1120 may be a phone keypad or any other type of keypad.

A/V port 1108 accepts and/or transmits video and/or audio signals. For example, A/V port 1108 may be a digital port that accepts a cable suitable to carry digital audio and video data. Further, A/V port 1108 may include RCA jacks to accept composite inputs. Still further, A/V port 1108 may include a VGA connector to accept analog video signals. In some embodiments, mobile device 1100 may be tethered to an external signal source through A/V port 1108, and mobile device 1100 may project content accepted through A/V port 1108. In other embodiments, mobile device 1100 may be an originator of content, and A/V port 1108 is used to transmit content to a different device.

Audio port 1102 provides audio signals. For example, in some embodiments, mobile device 1100 is a media player that can store and play audio and video. In these embodiments, the video may be projected at 980 and the audio may be output at audio port 1102. In other embodiments, mobile device 1100 may be an accessory projector that receives audio and video at A/V port 1108. In these embodiments, mobile device 1100 may project the video content at 980, and output the audio content at audio port 1102.

Mobile device 1100 also includes card slot 1106. In some embodiments, a memory card inserted in card slot 1106 may provide a source for audio to be output at audio port 1102 and/or video data to be projected at 980. Card slot 1106 may receive any type of solid state memory device, including for example, Multimedia Memory Cards (MMCs), Memory Stick DUOS, secure digital (SD) memory cards, and Smart Media cards. The foregoing list is meant to be exemplary, and not exhaustive.

Figure 12:
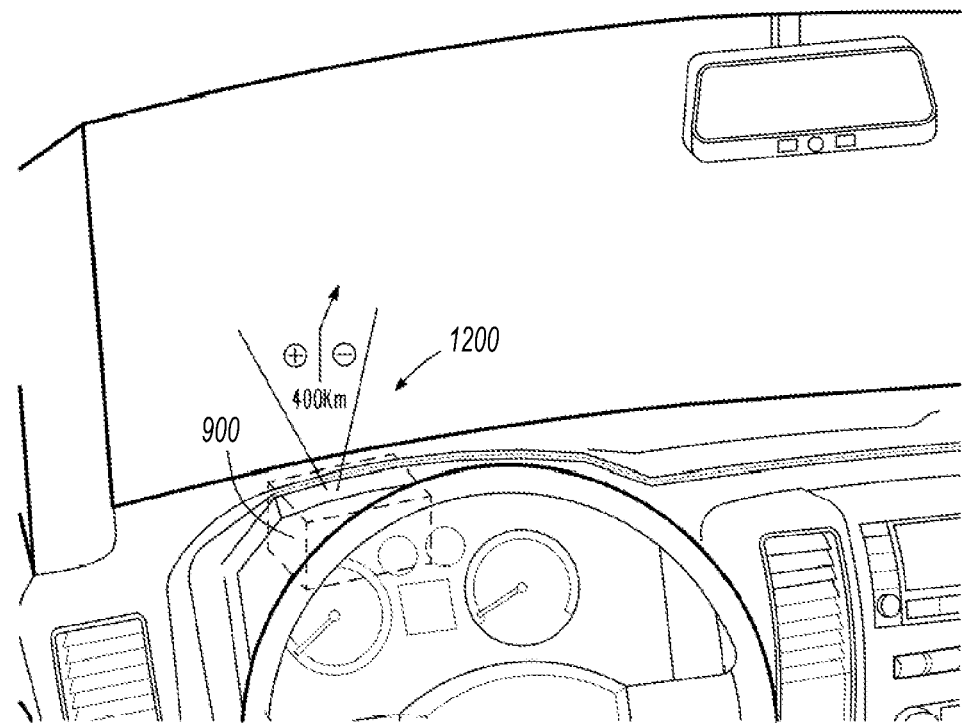
FIG. 12 shows a head-up display system in accordance with various embodiments of the invention.

FIG. 12 shows a head-up display system in accordance with various embodiments of the invention. Projector 900 is shown mounted in a vehicle dash to project the head-up display at 1200. Although an automotive head-up display is shown in FIG. 12, this is not a limitation of the present invention. For example, various embodiments of the invention include head-up displays in avionics application, air traffic control applications, and other applications.

Figure 13:
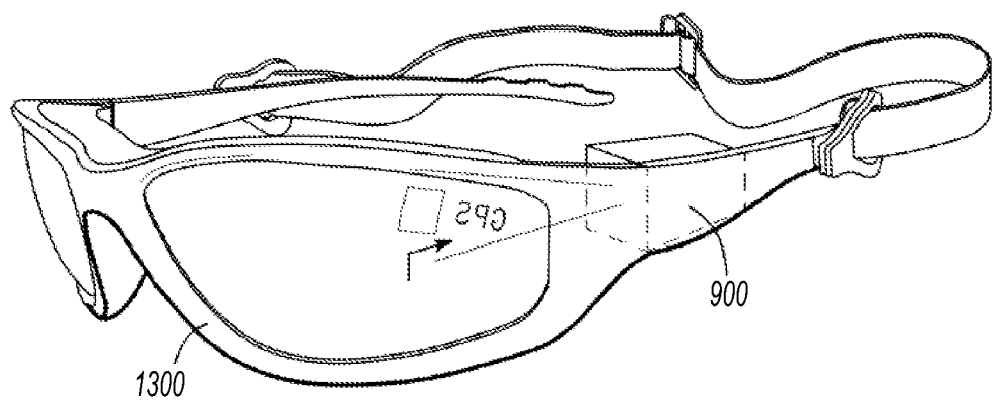
FIG. 13 shows eyewear in accordance with various embodiments of the invention.

FIG. 13 shows eyewear in accordance with various embodiments of the invention. Eyewear 1300 includes projector 900 to project a display in the eyewear's field of view. In some embodiments, eyewear 1300 is see-through and in other embodiments, eyewear 1300 is opaque. For example, eyewear may be used in an augmented reality application in which a wearer can see the display from projector 900 overlaid on the physical world. Also for example, eyewear may be used in a virtual reality application, in which a wearer's entire view is generated by projector 900. Although only one projector 900 is shown in FIG. 13, this is not a limitation of the present invention. For example, in some embodiments, eyewear 1300 includes two projectors; one for each eye.

Figure 14:
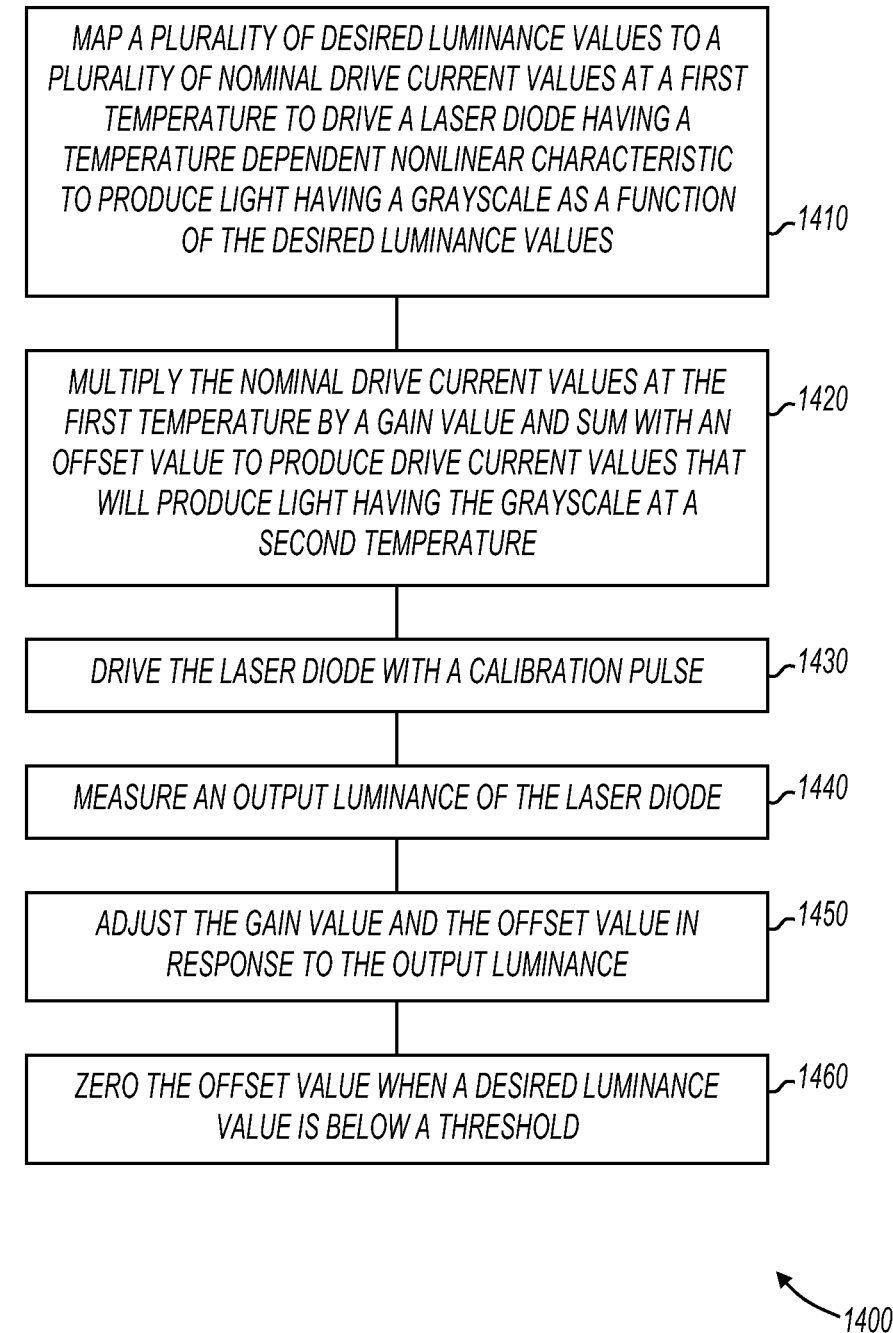
FIG. 14 shows a flowchart in accordance with various embodiments of the present invention.

FIG. 14 shows a flowchart in accordance with various embodiments of the present invention. In some embodiments, method 1400, or portions thereof, is performed by a scanning laser projector, embodiments of which are shown in previous figures. In other embodiments, method 1400 is performed by a series of circuits or an electronic system. Method 1400 is not limited by the particular type of apparatus performing the method. The various actions in method 1400 may be performed in the order presented, or may be performed in a different order. Further, in some embodiments, some actions listed in FIG. 14 are omitted from method 1400.

Method 1400 is shown beginning with block 1410 in which a plurality of desired luminance values is mapped to a plurality of nominal drive current values at a first temperature. This corresponds to a look up table loaded with a nonlinear temperature dependent diode characteristic for one temperature. For example, referring back to FIG. 4, a look up table may be loaded with data points corresponding to the diode curve at T0. The nominal drive current values are used to drive a laser diode to produce light having a grayscale as a function of the desired luminance values. For example, the laser diode may be used to output pixels of light having different luminance values. The different luminance values can take on any grayscale value as a function of the desired luminance value. When the nominal drive current values are used to drive the laser diode, the grayscale is correct as long as the diode is operating at the first temperature.

At 1420, the nominal drive current values are multiplied by a gain value and summed with an offset value to produce drive current values that will produce light having the grayscale at a second temperature. This corresponds to modifying the output of the look up table so that the grayscale is correct at a second temperature. For example, referring back to FIG. 5, the second temperature may be T2, and the gain value and offset value are chosen such that the diode curve at T2 is compensated for.

At 1430, the laser diode is drive with a calibration pulse, and at 1440, an output luminance of the laser diode is measured. At 1450, the gain value and offset value are adjusted in response to the measured output luminance. As described above, calibration pulses may be sent at any frequency and/or periodicity. For example, in scanning laser projection systems, calibration pulses may be sent at the end of every frame or at then end of every nth frame.

In some embodiments, a feedback loop determines a calibration pulse drive current value that results in an expected output luminance value. The calibration pulse drive current value is shown in previous figures as $I_S$. The calibration pulse drive current value is provided to a gain and offset determination component that determines and/or adjusts the gain value and offset value. In some embodiments, different methods are used to determine the gain value and offset value based on the desired luminance value. For example, when a desired luminance value is below a threshold (e.g., the calibration pulse level), then the offset value may be set to zero (1460). Various methods for determining gain values and offset values are described above with reference to gain and offset determination component 130 (FIG. 7).

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. An apparatus comprising:
    a laser diode having a first nonlinear current to output luminance characteristic at a first temperature;
    a look-up table having an inverse of the first nonlinear current to output luminance characteristic to map desired luminance values to laser diode current values;
    a multiplier coupled to multiply the laser diode current values by a gain value to produce a scaled laser diode current value;
    an adder coupled to sum the scaled laser diode current value and an offset value; and a feedback loop to measure actual output luminance at a second temperature and adjust the gain value and the offset value, wherein the feedback loop comprises:
a photodiode to measure the actual output luminance; and
a difference circuit to compare the actual output luminance with an expected output luminance, and wherein the feedback loop is operable to set the offset value to zero when the desired luminance is below a threshold.

2. An apparatus comprising:
a laser diode having a first nonlinear current to output luminance characteristic at a first temperature;
a look-up table having an inverse of the first nonlinear current to output luminance characteristic to map desired luminance values to laser diode current values;
a multiplier coupled to multiply the laser diode current values by a gain value to produce a scaled laser diode current value;
an adder coupled to sum the scaled laser diode current value and an offset value; and
a feedback loop to measure actual output luminance at a second temperature and adjust the gain value and the offset value, wherein the feedback loop comprises:
a photodiode to measure the actual output luminance; and
a difference circuit to compare the actual output luminance with an expected output luminance corresponding to a calibration pulse, wherein the feedback loop is operable to set the offset value to zero when the desired luminance is below the expected output luminance corresponding to a calibration pulse.

* * * * *